US006812520B2

(12) United States Patent
Ebina et al.

(10) Patent No.: US 6,812,520 B2
(45) Date of Patent: Nov. 2, 2004

(54) SEMICONDUCTOR DEVICE AND METHOD OF MANUFACTURING THE SAME

(75) Inventors: Akihiko Ebina, Fujimi-machi (JP); Susumu Inoue, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 62 days.

(21) Appl. No.: 10/234,197

(22) Filed: Sep. 5, 2002

(65) Prior Publication Data

US 2003/0058705 A1 Mar. 27, 2003

(30) Foreign Application Priority Data

Sep. 25, 2001 (JP) ........................................ 2001-292128

(51) Int. Cl.$^7$ ............................................ H01L 29/788
(52) U.S. Cl. ...................... 257/316; 257/401; 257/499; 438/267
(58) Field of Search ................................ 257/401, 499; 438/267

(56) References Cited

U.S. PATENT DOCUMENTS

| 5,408,115 | A | 4/1995 | Chang |
| 5,422,504 | A | 6/1995 | Chang et al. |
| 5,494,838 | A | 2/1996 | Chang et al. |
| 5,663,923 | A | 9/1997 | Baltar et al. |
| 5,969,383 | A | 10/1999 | Chang et al. |
| 6,177,318 | B1 | 1/2001 | Ogura et al. |
| 6,248,633 | B1 * | 6/2001 | Ogura et al. ................ 438/267 |
| 6,255,166 | B1 | 7/2001 | Ogura et al. |
| 6,288,431 | B1 * | 9/2001 | Iwasa et al. ................ 257/401 |
| 6,413,821 | B1 | 7/2002 | Ebina et al. |
| 2003/0157767 | A1 | 8/2003 | Kasuya |
| 2003/0166320 | A1 | 9/2003 | Kasuya |
| 2003/0166321 | A1 | 9/2003 | Kasuya |
| 2003/0166322 | A1 | 9/2003 | Kasuya |
| 2003/0186505 | A1 | 10/2003 | Shibata |
| 2003/0190805 | A1 | 10/2003 | Inoue |
| 2003/0211691 | A1 | 11/2003 | Ueda |

FOREIGN PATENT DOCUMENTS

| JP | A 7-161851 | 6/1995 |
| JP | B1 2978477 | 9/1999 |
| JP | A 2001-156188 | 6/2001 |

OTHER PUBLICATIONS

U.S. patent application Ser. No. 10/052,255, Ebina et al., filed Jan. 23, 2002.
U.S. patent application Ser. No. 09/953,855, Ebina et al., filed Sep. 18, 2001.
U.S. patent application Ser. No. 10/052,549, Ebina et al., filed Jan. 23, 2002.
U.S. patent application Ser. No. 10/234,095, Ebina et al., filed Sep. 5, 2002.
U.S. patent application Ser. No. 10/244,623, Ebina et al., filed Sep. 17, 2002.
U.S. patent application Ser. No. 10/244,627, Ebina et al., filed Sep. 17, 2002.
Yutaka Hayashi et al., "Twin Monos Cell with Dual Control Gates," 2000, IEEE VLSI Technology Digest.

(List continued on next page.)

Primary Examiner—David Nelms
Assistant Examiner—Mai-Huong Tran
(74) Attorney, Agent, or Firm—Oliff & Berridge, PLC

(57) ABSTRACT

A semiconductor device of the present invention includes memory cells. Each of the memory cells includes a word gate formed over a semiconductor substrate with a second gate insulating layer interposed therebetween, an impurity layer, and first and second control gates in the shape of sidewalls. The first and second control gates adjacent to the impurity layer interposed therebetween is connected with a common contact section. The common contact section includes a contact conductive layer, a stopper insulating layer, and a cap insulating layer. The contact conductive layer is continuous with the first and second control gates. The cap insulating layer is formed at least over the stopper insulating layer.

13 Claims, 10 Drawing Sheets

OTHER PUBLICATIONS

Kuo–Tung Chang et al., "A New Sonos Memory Using Source–Side Injection for Programming," IEEE Electron Device Letters, vol. 19, No. 7, Jul. 1998, pp. 253–255.

Wei–Ming Chen et al., "A Novel Flash Memory Device With S Plit Gate Source Side Injection and Ono Charge Storage Stack (SPIN)," 1997, VLSI Technology Digest, pp 63–64.

U.S. patent application Ser. No. 10/690,025, Kasuya, filed Oct. 22, 2003.

U.S. patent application Ser. No. 10/636,562, Inoue, filed Aug. 8, 2003.

U.S. patent application Ser. No. 10/636,581, Yamamukai, filed Aug. 8, 2003.

U.S. patent application Ser. No. 10/636,582, Inoue, filed Aug. 8, 2003.

U.S. patent application Ser. No. 10/614,985, Inoue, filed Jul. 9, 2003.

U.S. patent application Ser. No. 10/689,993, Kasuya, filed Oct. 22, 2003.

U.S. patent application Ser. No. 10/689,987, Kasuya, filed Oct. 22, 2003.

U.S. patent application Ser. No. 10/689,990, Kasuya, filed Oct. 22, 2003.

* cited by examiner

SEMICONDUCTOR DEVICE AND METHOD OF MANUFACTURING THE SAME

Japanese Patent Application No. 2001-292128 filed on Sep. 25, 2001, is hereby incorporated by reference in its entirety.

BACKGROUND OF THE INVENTION

The present invention relates to a semiconductor device in which nonvolatile memory devices including two charge storage regions for one word gate are arranged in an array, and a method of manufacturing the same.

As one type of nonvolatile semiconductor memory device, a MONOS (Metal Oxide Nitride Oxide Semiconductor) or SONOS (Silicon Oxide Nitride Oxide Silicon) nonvolatile semiconductor memory device is known. In such a memory device, a gate insulating layer between a channel region and a control gate is formed of a stacked film consisting of silicon oxide layers and a silicon nitride layer, and charges are trapped in the silicon nitride layer.

A device shown in FIG. 15 is known as a MONOS nonvolatile semiconductor memory device (Y. Hayashi. et al., 2000 Symposium on VLSI Technology Digest of Technical Papers, pp. 122 to 123).

In this MONOS memory cell 100, a word gate 14 is formed on a semiconductor substrate 10 with a second gate insulating layer 12 interposed therebetween. A first control gate 20 and a second control gate 30 in the shape of sidewalls are disposed on two opposing sides of the word gate 14, respectively. A first gate insulating layer 22 is present between the bottom of the first control gate 20 and the semiconductor substrate 10. An insulating layer 24 is present between the side of the first control gate 20 and the word gate 14. A first gate insulating layer 32 is present between the bottom of the second control gate 30 and the semiconductor substrate 10. An insulating layer 34 is present between the side of the second control gate 30 and the word gate 14. Impurity layers 16 and 18 which make up either a source region or a drain region are formed in the semiconductor substrate 10 between the control gate 20 and the control gate 30 which face each other in the adjacent memory cells.

As described above, one memory cell 100 includes two MONOS memory elements, one on each side of the word gate 14. These two MONOS memory elements are controlled separately. Therefore, one memory cell 100 is capable of storing two bits of information.

BRIEF SUMMARY OF THE INVENTION

The present invention may provide a semiconductor device including MONOS nonvolatile memory devices, each having two charge storage regions, and a method of manufacturing the same.

Semiconductor Device

One aspect of the present invention relates to a semiconductor device including a memory cell array in which nonvolatile memory devices are arranged in a matrix of a plurality of rows and columns, wherein each of the nonvolatile memory devices comprises:

a word gate which is formed over a semiconductor layer with a second gate insulating layer interposed therebetween;

an impurity layer which is formed in the semiconductor layer and forms at least one of a source region and a drain region; and first and second control gates in a shape of sidewalls which are formed along two opposing sides of the word gate, respectively, wherein the first control gate is disposed over the semiconductor layer with a first gate insulating layer interposed therebetween, a first side insulating layer being interposed between the first control gate and the word gate, wherein the second control gate is disposed over the semiconductor layer with a first gate insulating layer interposed therebetween, a first side insulating layer being interposed between the second control gate and the word gate, wherein each of the first and second control gates extends in a first direction, wherein the first and second control gates adjacent in a second direction, which intersects the first direction, with the impurity layer interposed therebetween are connected with a common contact section, wherein the common contact section includes a contact conductive layer, a stopper insulating layer, and a cap insulating layer, wherein the contact conductive layer is continuous with the first and second control gates, wherein the stopper insulating layer is disposed outside the contact conductive layer, and wherein the cap insulating layer is formed at least over the stopper insulating layer.

According to the semiconductor device of this aspect of the present invention, since the first and second control gates in the shape of sidewalls are connected with the common contact section, electrical connection with narrow control gates can be secured reliably.

The semiconductor device of this aspect of the present invention may have the following features.

(A) The contact conductive layer may be disposed inside the cap insulating layer with a second side insulating layer interposed therebetween. In this case, the second side insulating layer may be formed of the same material as the first side insulating layer.

(B) The contact conductive layer may be formed of the same material as the first and second control gates.

(C) An upper surface of the contact conductive layer and an upper surface of the stopper insulating layer may be formed on substantially the same level.

(D) The stopper insulating layer may be formed of a material including silicon nitride as an essential component, and the cap insulating layer may be formed of a material including silicon oxide as an essential component.

(E) An interlayer dielectric may be further provided over the cap insulating layer, the contact conductive layer may include a depression on which a contact hole is formed, the contact hole being formed through the cap insulating layer and the interlayer dielectric, and the contact hole may be filled with a plug conductive layer.

(F) The contact conductive layer may be disposed over the semiconductor layer with a contact insulating layer interposed therebetween, and the contact insulating layer may be formed of the same material as the first gate insulating layer.

(G) An upper end of the first side insulating layer may be located higher than the first and second control gates. This enables an embedding insulating layer which covers the control gates to be formed reliably. Specifically, the adjacent first and second control gates are covered with an embedding insulating layer. The embedding insulating layer is formed between the two side insulating layers facing each other which are disposed in contact with the first and second control gates.

(H) The first and second control gates adjacent to each other may be covered with an insulating layer.

(I) The common contact section may be provided adjacent to an end of the impurity layer. A plurality of the impurity layers may be arranged, and a plurality of the common contact sections may be provided alternately on one ends and opposite ends of the plurality of the impurity layers.

(J) Each of the first gate insulating layer and the first side insulating layer may be formed of a stacked film including a first silicon oxide layer, a silicon nitride layer, and a second silicon oxide layer.

Method of Manufacturing Semiconductor Device

Another aspect of the present invention relates to a method of manufacturing a semiconductor device including a memory cell array in which nonvolatile memory devices are arranged in a matrix of a plurality of rows and columns, the method comprising steps of:

forming a first insulating layer to be a second gate insulating layer over a semiconductor layer;

forming a first conductive layer over the first insulating layer;

forming a stopper layer over the first conductive layer;

forming a gate layer by patterning the first conductive layer and the stopper layer;

forming a first gate insulating layer at least over the semiconductor layer;

forming a first side insulating layer along two opposing sides of the gate layer;

forming a second conductive layer in a formation region of the memory cell array;

forming first and second control gates in a shape of sidewalls by forming a mask on the second conductive layer in a region corresponding to a formation region of a common contact section and anisotropically etching the second conductive layer;

forming a contact conductive layer in the formation region of the common contact section by polishing a second insulating layer and the second conductive layer by using a chemical mechanical polishing method so that the stopper layer is exposed, after forming the second insulating layer in the formation region of the memory cell array;

forming an impurity layer which forms at least one of a source region and a drain region in the semiconductor layer;

forming a mask on a third insulating layer in a region corresponding to the formation region of the common contact section after forming the third insulating layer to be a cap insulating layer in the formation region of the memory cell array, and patterning the third insulating layer, then forming the cap insulating layer in the formation region of the common contact section by; and forming a word gate and a word line connected with the word gate by patterning the gate layer, a third conductive layer and the stopper layer after forming the third conductive layer in the formation region of the memory cell array, and forming a stopper insulating layer in the formation region of the common contact section.

According to the method of manufacturing a semiconductor device of this aspect of the present invention, since the common contact section can be formed together with the first and second control gates in the shape of sidewalls, reliable electrical connection can be secured through the common contact section.

The manufacturing method according to this aspect of the present invention may have the following features.

(a) The step of patterning the gate layer may include a step of forming the stopper insulating layer over the first conductive layer.

(b) The contact conductive layer may be formed in the same formation step as the control gates.

(c) The method may further comprise steps of forming a contact insulating layer over the semiconductor layer and forming a second side insulating layer along the contact conductive layer, in the formation region of the common contact section, the contact insulating layer may be formed in the same step as the step of forming the first gate insulating layer, and the second side insulating layer may be formed in the same step as the step of forming the first side insulating layer.

(d) The method may further comprise steps of:

forming an interlayer dielectric in the formation region of the memory cell array and forming a contact hole on the contact conductive layer through the cap insulating layer and the interlayer dielectric; and filling the contact hole with a plug conductive layer.

(e) The stopper layer may be formed of a material including silicon nitride as an essential component, and the third insulating layer may be formed of a material including silicon oxide as an essential component.

(f) Each of the first gate insulating layer and the first side insulating layer may be formed in the same formation step and may be formed of a stacked film including a first silicon oxide layer, a silicon nitride layer, and a second silicon oxide layer.

(g) The first side insulating layer may be formed so that an upper end of the first side insulating layer is located higher than the first and second control gates.

(h) The first and second control gates adjacent to each other with the impurity layer interposed therebetween may be formed so as to be covered with an embedding insulating layer in the step of polishing the second insulating layer by using the chemical mechanical polishing method (hereinafter called "CMP method").

(i) The common contact section may be formed adjacent to an end of the impurity layer. A plurality of the impurity layers may be arranged, and a plurality of the common contact sections may be provided alternately on one ends and opposite ends of the plurality of the impurity layers.

DETAILED DESCRIPTION OF THE EMBODIMENT

Figure 1:
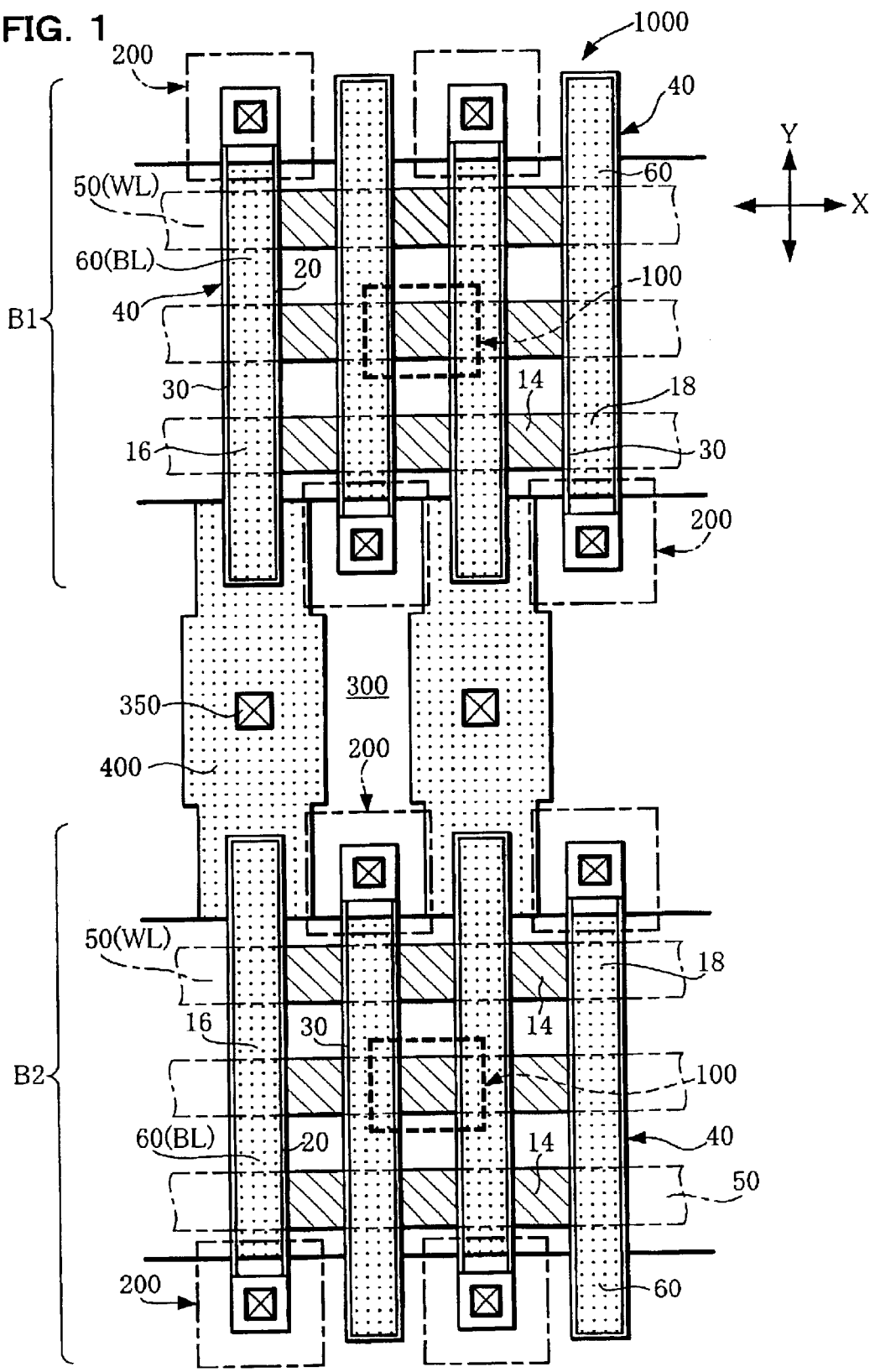
FIG. 1 is a plan view schematically showing a layout of a semiconductor device according to an embodiment of the present invention.
Figure 2:
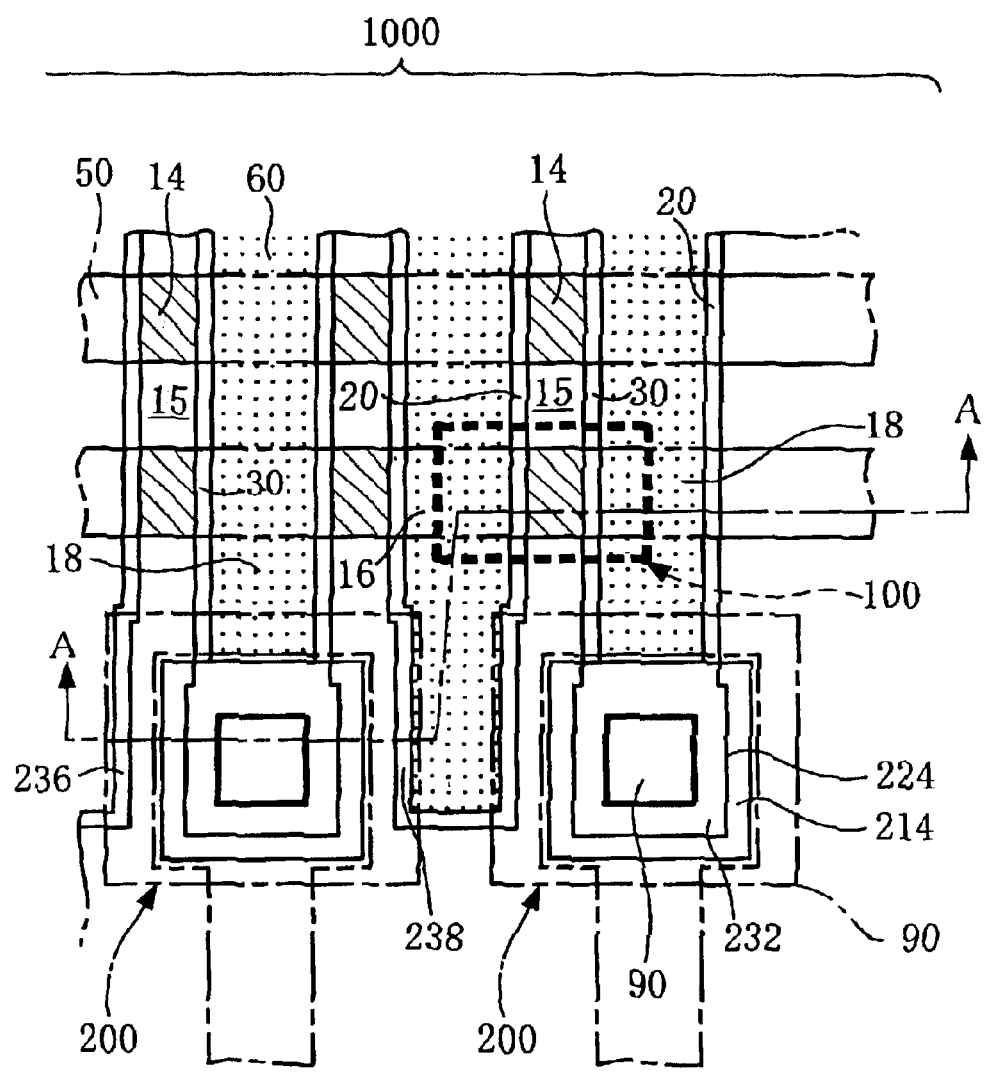
FIG. 2 is a plan view schematically showing the feature of the semiconductor device according to the embodiment of the present invention.
Figure 3:
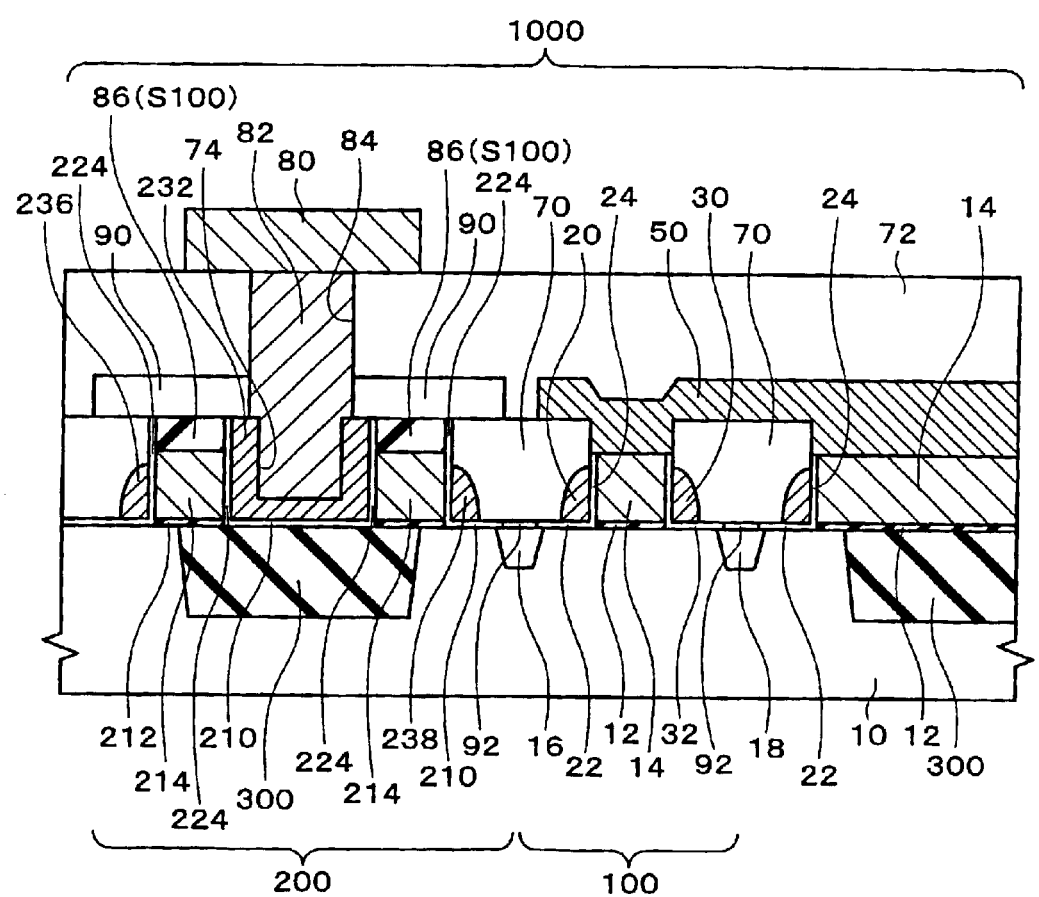
FIG. 3 is a cross-sectional view schematically showing the section along the line A—A shown in FIG. 2.

FIG. 1 is a plan view schematically showing a layout of a memory cell array which makes up a semiconductor device according to an embodiment of the present invention. FIG. 2 is a plan view schematically showing part of the semiconductor device according to the present embodiment. FIG. 3 is a cross-sectional view schematically showing the section along the line A—A shown in FIG. 2.

The semiconductor device according to the present embodiment includes a memory cell array 1000 in which MONOS nonvolatile memory devices (hereinafter called "memory cells") 100 are arranged in a plurality of rows and columns in the shape of a lattice. The memory cell array 1000 is divided into a plurality of blocks.

Device Structure

The layout of the semiconductor device of the present embodiment is described below with reference to FIG. 1.

FIG. 1 shows a first block B1 and a second block B2 adjacent thereto. An element isolation region 300 is formed in part of a region between the first block B1 and the second block B2. A plurality of word lines (WL) 50 extending in the X direction (row direction) and a plurality of bit lines (BL) 60 extending in the Y direction (column direction) are provided in each of the blocks B1 and B2. One word line 50 is connected with a plurality of word gates 14 arranged in the X direction. The bit lines 60 are formed by impurity layers 16 and 18.

Conductive layers 40 which make up first and second control gates 20 and 30 are formed to enclose each of the impurity layers 16 and 18. Specifically, each of the first and second control gates 20 and 30 extends in the Y direction. One of the ends of a pair of first and second control gates 20 and 30 is connected by the conductive layer extending in the X direction. The other ends of the pair of first and second control gates 20 and 30 are connected with one common contact section 200. Therefore, each of the first and second control gates 20 and 30 has a function as the control gate of the memory cells and a function as an interconnect which connects the control gates arranged in the Y direction.

The common contact sections 200 are provided adjacent to the ends of the impurity layers 16 and 18, as shown in FIG. 1. The common contact sections 200 are alternately provided at one end and the opposite end of the impurity layers 16 and 18.

A single memory cell 100 includes one word gate 14, the first and second control gates 20 and 30 formed on two opposing sides of the word gate 14, and the impurity layers 16 and 18 formed in a semiconductor substrate outside the control gates 20 and 30. The impurity layers 16 and 18 are shared by the adjacent memory cells 100.

The impurity layer 16 formed in the block B1 and the impurity layer 16 formed in the block B2, which are adjacent in the Y direction, are electrically connected by the contact impurity layer 400 formed in the semiconductor substrate. The contact impurity layer 400 is formed on the side of the impurity layer 16 opposite to the side on which the common contact section 200 of the control gates is formed.

A contact 350 is formed on the contact impurity layer 400. The bit line 60 consisting of the impurity layer 16 is electrically connected with an upper interconnect layer by the contact 350.

The two impurity layers 18 adjacent in the Y direction are electrically connected by a contact impurity layer (not shown) on the side on which the common contact section 200 is not disposed.

As shown in FIG. 1, the planar layout of a plurality of common contact sections 200 in one block is in a zigzag arrangement. Similarly, the planar layout of a plurality of contact impurity layers 400 in one block is in a zigzag arrangement.

The planar structure and the cross-sectional structure of the semiconductor device are described below with reference to FIGS. 2 and 3.

The memory cell 100 includes the word gate 14 which is formed on a semiconductor substrate 10 with a second gate insulating layer 12 interposed therebetween, the impurity layers 16 and 18 which are formed in the semiconductor substrate 10 and make up either a source region or a drain region, and the first and second control gates 20 and 30 in the shape of sidewalls which are formed along two opposing sides of the word gate 14. Silicide layers 92 are formed on the impurity layers 16 and 18.

The first control gate 20 is disposed on the semiconductor substrate 10 with a first gate insulating layer 22 interposed therebetween and disposed on one side of the word gate 14 with a first side insulating layer 24 interposed therebetween. The second control gate 30 is disposed on the semiconductor substrate 10 with a first gate insulating layer 32 interposed therebetween and disposed on the other side of the word gate 14 with a first side insulating layer 34 interposed therebetween.

The first gate insulating layers 22 and 32 and the first side insulating layers 24 and 34 are ONO films. In more detail, the first gate insulating layers 22 and 32 and the first side insulating layers 24 and 34 are stacked films consisting of a first silicon oxide layer (bottom silicon oxide layer), a silicon nitride layer, and a second silicon oxide layer (top silicon oxide layer).

The first silicon oxide layers of the first gate insulating layers 22 and 32 function as a potential barrier between a channel region and a charge storage region.

The silicon nitride layers of the first gate insulating layers 22 and 32 function as a charge storage region in which carriers (electrons, for example) are trapped.

The second silicon oxide layers of the first gate insulating layers 22 and 32 form a potential barrier between the control gate and the charge storage region.

The first side insulating layers 24 and 34 electrically isolate the word gate 14 respectively from the first and second control gates 20 and 30. The upper ends of the first side 10 insulating layers 24 and 34 are located at a position higher than the upper ends of the first and second control gates 20 and 30 with respect to the semiconductor substrate 10 in order to prevent occurrence of short circuits between the word gate 14 and the first and second control gates 20 and 30.

In the present embodiment, the first side insulating layers 24 and 34 and the first gate insulating layers 22 and 32 are formed in the same formation step and have the same layer structure. The first side insulating layers 24 and 34 are formed so that the upper ends of the first side insulating layers 24 and 34 are located at a position higher than the first and second control gates 20 and 30. An embedding insulating layer 70 is formed between the first control gate 20 and the second control gate 30 facing each other in the adjacent memory cells 100. In the present embodiment, the first and second control gates 20 and 30 are covered with the embedding insulating layer 70. The embedding insulating layer 70 covers the first and second control gates 20 and 30 so that at least the first and second control gates 20 and 30 are not exposed. In more detail, the upper surface of the embedding insulating layer 70 is located at a position higher than the upper ends of the first side insulating layers 24 and 34. The first and second control gates 20 and 30 can be electrically isolated from the word gate 14 and the word line 50 more reliably by forming the embedding insulating layer 70 in this manner.

Conductive layers for supplying a predetermined potential to the first and second control gates 20 and 30 are formed in the common contact section 200. The common contact section 200 mainly includes a contact conductive layer 232, a stopper insulating layer 86, and a cap insulating layer 90.

The contact conductive layer 232 is disposed inside the stopper insulating layer 86 and a conductive layer 214 with a second side insulating layer 224 interposed therebetween. The contact conductive layer 232 is formed in the same formation step as the first and second control gates 20 and 30 so as to be continuous with the first and second control gates 20 and 30. Therefore, the contact conductive layer 232 and the first and second control gates 20 and 30 are formed of the same material.

The contact conductive layer 232 is disposed on the semiconductor substrate 10 with a contact insulating layer 210 interposed therebetween. A depression 74 is formed by the contact conductive layer 232. The depression 74 is filled with a plug conductive layer 82 described later.

An interlayer dielectric 72 is formed on the cap insulating layer 90, the word line 50, and the embedding insulating layer 70 in the area in which the cap insulating layer 90 and the word line 50 are not formed. A contact hole 84 is formed on the depression 74 formed by the contact conductive layer 232 through the cap insulating layer 90 and the interlayer dielectric 72. Specifically, the contact hole 84 reaches the contact conductive layer 232 through the cap insulating layer 90 and the interlayer dielectric 72. The contact hole 84 is filled with the plug conductive layer 82 consisting of a tungsten plug or a copper plug.

The stopper insulating layer 86 is disposed outside the contact conductive layer 232, as shown in FIG. 3. The stopper insulating layer 86 is formed on the conductive layer 214 described later. The stopper insulating layer 86 is formed of a material containing silicon nitride as an essential component, for example. In the present embodiment, the contact conductive layer 232 and the stopper insulating layer 86 may be formed so that the upper surfaces of these layers are approximately on the same level.

The cap insulating layer 90 is formed at least on the stopper insulating layer 86. The cap insulating layer 90 is formed of a material containing silicon oxide as an essential component, for example.

The common contact section 200 further includes the conductive layer 214 and conductive layers 236 and 238.

The conductive layer 214 is formed in the same formation step as the word gate 14. In this case, the conductive layer 214 is formed of the same material as the word gate 14. In the present embodiment, the conductive layer 214 is disposed over the semiconductor substrate 10 with an insulating layer 212 interposed therebetween.

The insulating layer 212 which makes up the common contact section 200 is formed in the same step as the second gate insulating layer 12 which makes up the memory cell 100 and have the same layer structure. The contact insulating layer 210 and the second side insulating layer 224 which make up the common contact section 200 are formed in the same step as the first gate insulating layers 22 and 32 and the first side insulating layers 24 and 34 which make up the memory cell 100 and have the same layer structure. Specifically, the contact insulating layer 210 and the second side insulating layer 224 are formed of stacked films consisting of the first silicon oxide layer, the silicon nitride layer, and the second silicon oxide layer in the same manner as the first gate insulating layers 22 and 32 and the first side insulating layers 24 and 34.

As shown in FIG. 3, the common contact section 200 further includes conductive layers 236 and 238 in the shape of sidewalls. The conductive layer 236 is continuous with the first control gate 20. The first control gate 20 continuous with the conductive layer 236 is adjacent to the second control gate 30 continuous with the contact conductive layer 232. The conductive layer 238 is continuous with the second control gate 30. The second control gate 30 continuous with the conductive layer 238 is adjacent to the first control gate 20 continuous with the contact conductive layer 232.

Each of the conductive layers 236 and 238 is disposed on one side of the conductive layer 214 with the second side insulating layer 224 interposed therebetween. The conductive layers 236 and 238 are formed in the same formation step as the first and second control gates 20 and 30 and the contact conductive layer 232 and formed of the same material as these layers.

The semiconductor device of the present embodiment illustrates the case where the conductive layers 236 and 238 are in the shape of sidewalls. However, the shape of the conductive layers 236 and 238 is not limited thereto.

According to the semiconductor device of the present embodiment, every pair of first and second control gates 20 and 30 in the shape of sidewalls is connected with the common contact section 200 in the memory cell array 1000. The common contact section 200 includes the contact conductive layer 232, the stopper insulating layer 86 which is formed outside the contact conductive layer 232, and the cap insulating layer 90. The cap insulating layer 90 is formed at least on the stopper insulating layer 86. Therefore, electrical connection between the common contact section 200 and the control gates 20 and 30 can be secured reliably. Specifically, the control gates 20 and 30 of the semiconductor device of the present embodiment are in the shape of sidewalls and generally have a width of less than 0.1 μm. Therefore, electrical connection between the control gates 20 and 30 and the common contact section 200 can be secured by the contact conductive layer 232. As a result, electrical contact with the control gates 20 and 30 can be secured in the smallest area by using the common contact section 200.

Method of Manufacturing Semiconductor Device

A method of manufacturing the semiconductor device according to the present embodiment is described below with reference to FIGS. 4 to 14. Each cross-sectional view corresponds to the section along the line A—A shown in FIG. 2. In FIGS. 4 to 14, sections the same as those shown in FIGS. 1 to 3 are indicated by the same symbols. Description of these sections given above is omitted.

Figure 4:
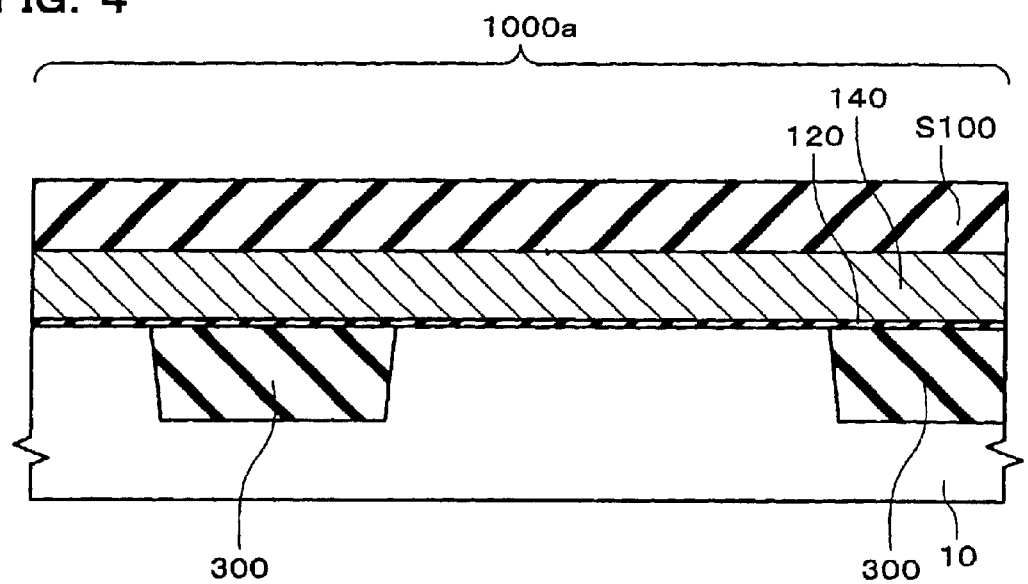
FIG. 4 is a cross-sectional view showing a step of a method of manufacturing the semiconductor device shown in FIGS. 1 to 3.
Figure 5:
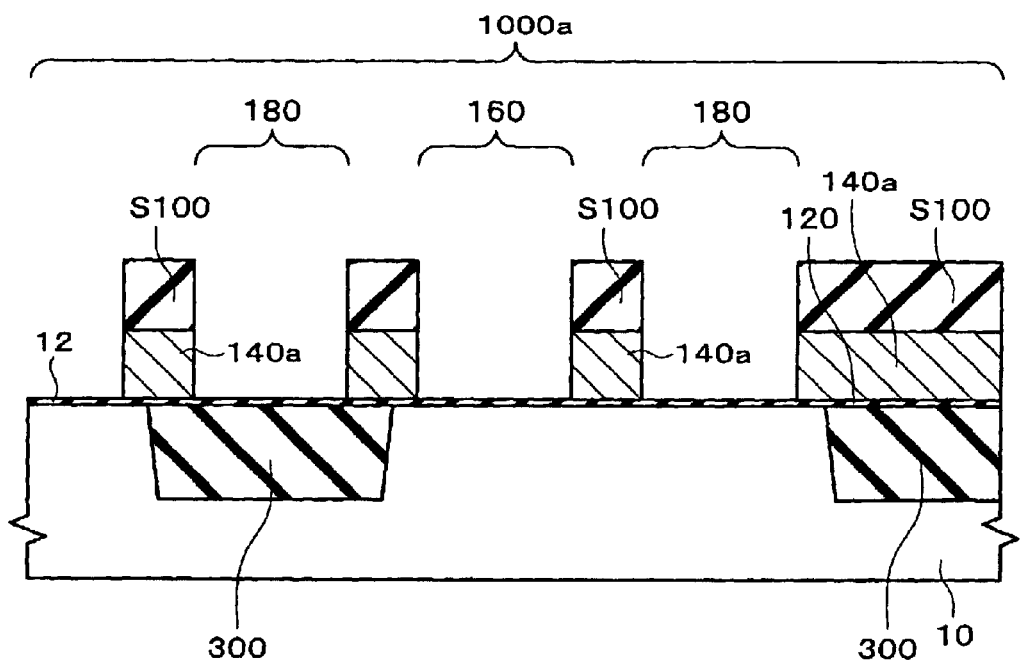
FIG. 5 is a cross-sectional view showing another step of the method of manufacturing the semiconductor device shown in FIGS. 1 to 3.

(1) As shown in FIG. 4, the element isolation region 300 is formed on the surface of the semiconductor substrate 10 in a region 1000a in which the memory cell array 1000 shown in FIG. 1 is formed (hereinafter called "memory cell array formation region") by using a LOCOS method, a trench isolation method, or the like. The contact impurity layer 400 (see FIG. 1) is formed in the semiconductor substrate 10 by ion implantation.

A first insulating layer 120 which becomes the first gate insulating layer is formed on the surface of the semiconductor substrate 10. A first conductive layer 140 which becomes the word gate 14 and the conductive layer 214 is deposited on the first insulating layer 120. The first conductive layer 140 is formed of doped polysilicon. A stopper layer S100 used in a subsequent CMP step is formed on the first conductive layer 140. The stopper layer S100 is formed of a silicon nitride layer, for example.

Figure 6:
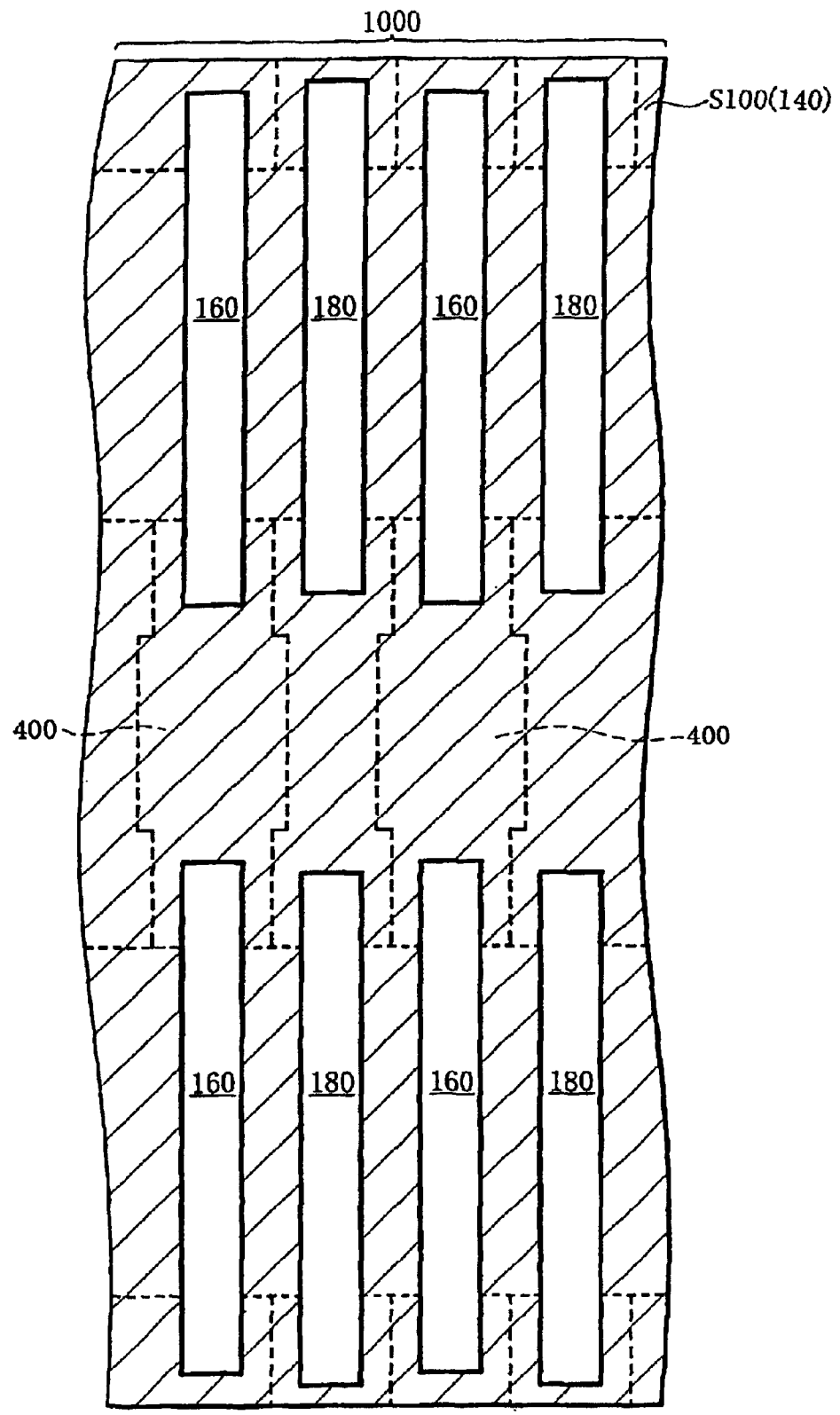
FIG. 6 is a plan view showing another step of the method of manufacturing the semiconductor device shown in FIG. 5.

(2) The first conductive layer 140 and the stopper layer S100 are patterned by using conventional lithography and etching. A gate layer 140a which becomes the word gate 14 is formed by this step. In this patterning step, a laminate of the gate layer 140a and the stopper layer S100 is formed over the entire surface of the semiconductor substrate 10 in the memory cell array formation region 1000a. FIG. 6 is a plan view showing a state after patterning. Openings 160 and 180 are formed in a laminate consisting of the gate layer 140a and the stopper layer S100 in the memory cell array formation region 1000a by this patterning. The openings 160 and 180 approximately correspond to regions in which the impurity layers 16 and 18 are formed by subsequent ion implantation. The first side insulating layers 24 and 34 and the first and second control gates 20 and 30 are formed along the sides of the openings 160 and 180 in a subsequent step.

Figure 7:
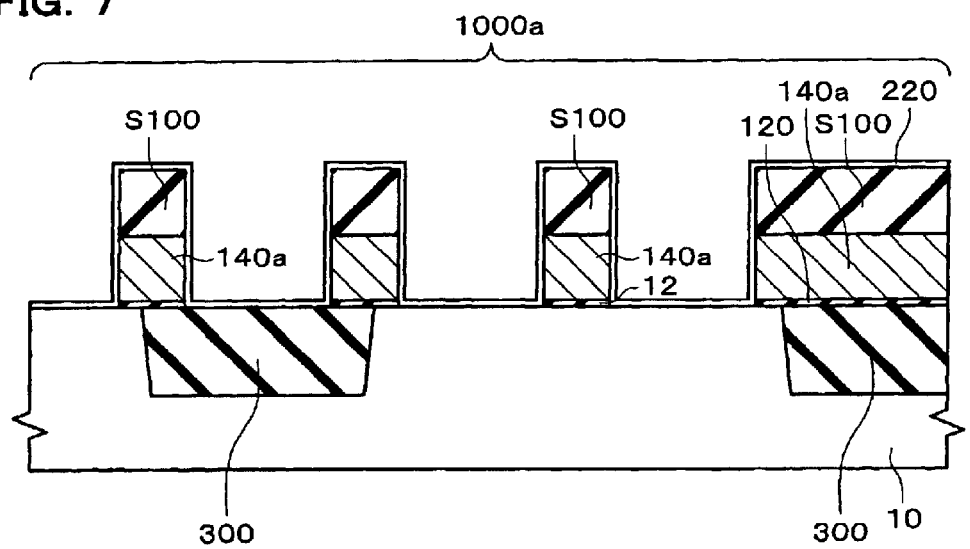
FIG. 7 is a cross-sectional view showing another step of the method of manufacturing the semiconductor device shown in FIGS. 1 to 3.

(3) As shown in FIG. 7, an ONO film 220 is formed over the entire surface of the semiconductor substrate 10. The ONO film 220 is formed by depositing the first silicon oxide layer, the silicon nitride layer, and the second silicon oxide layer in that order. The first silicon oxide layer may be deposited by using a thermal oxidation method, a CVD method, or the like. The silicon nitride layer may be deposited by using a CVD method or the like. The second silicon oxide layer may be deposited by using a CVD method such as a high temperature oxidation (HTO) method. After depositing these layers, it is preferable to densify each layer by annealing.

The ONO film 220 becomes the first gate insulating layer 22, the first side insulating layer 24, and the contact insulating layer 210 and the second side insulating layer 224 of the common contact section 200 (see FIG. 3) by subsequent patterning.

Figure 8:
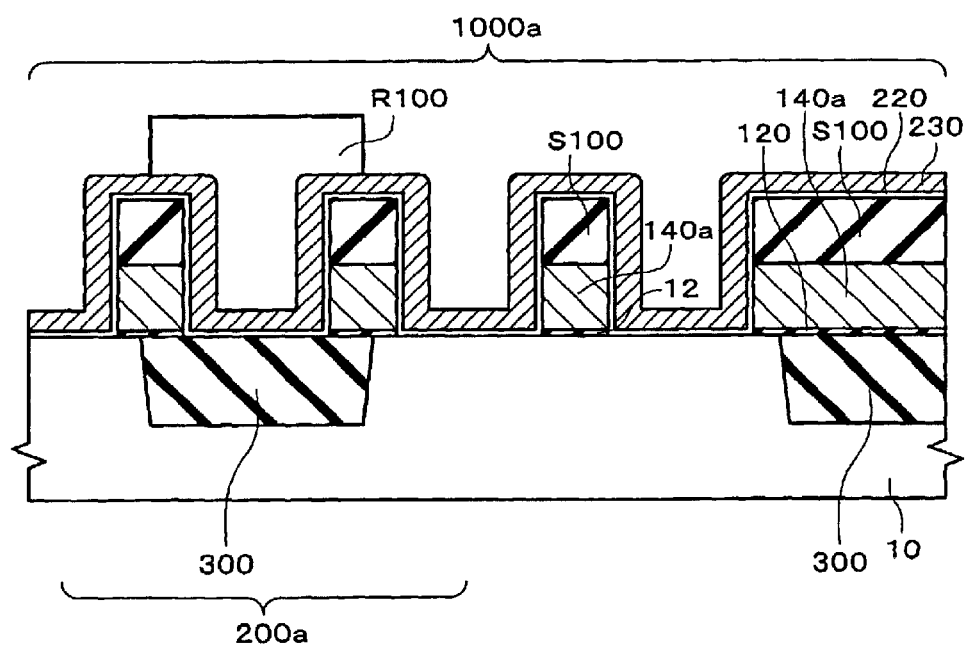
FIG. 8 is a cross-sectional view showing another step of the method of manufacturing the semiconductor device shown in FIGS. 1 to 3.

(4) As shown in FIG. 8, a doped polysilicon layer (second conductive layer) 230 is formed over the entire surface of the ONO film 220 in the memory cell array formation region 1000a. The conductive layer 40 which makes up the first and second control gates 20 and 30 (see FIG. 1), and the contact conductive layer 232 and the conductive layers 236 and 238 which make up the common contact section 200 (see FIG. 3) are formed from the doped polysilicon layer 230 by patterning and etching steps.

A resist layer R100 is formed in a region 200a in which the common contact section 200 is formed (hereinafter called "common contact section formation region"). In the present embodiment, the resist layer R100 is provided at a position approximately corresponding to the common contact section formation region 200a, as shown in FIG. 8. The resist layer R100 is formed at least in the region in which the contact conductive layer 232 is formed in a subsequent step.

Figure 9:
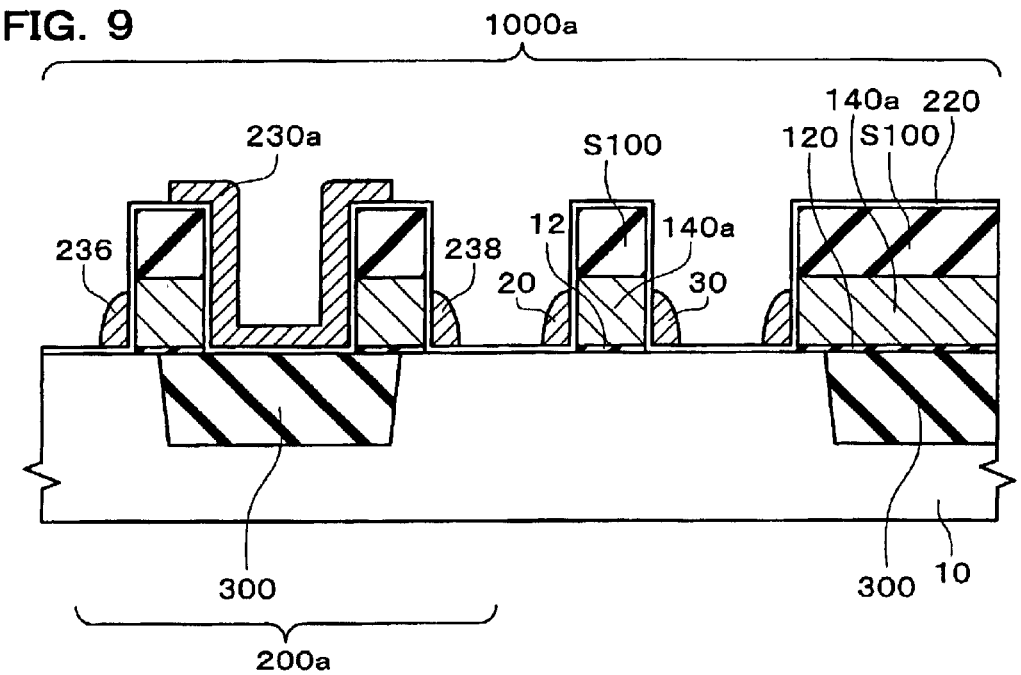
FIG. 9 is a cross-sectional view showing another step of the method of manufacturing the semiconductor device shown in FIGS. 1 to 3.

(5) As shown in FIG. 9, the entire surface of the doped polysilicon layer 230 (see FIG. 8) is anisotropically etched by using the resist layer R100 as a mask, whereby the first and second control gates 20 and 30, a contact conductive layer 230a, and the conductive layers 236 and 238 are formed. The contact conductive layer 230a and the conductive layers 236 and 238 are formed in the common contact section formation region 200a.

Specifically, the first and second control gates 20 and 30 in the shape of sidewalls and the conductive layers 236 and 238 are formed along the sides of the exposed openings 160 and 180 (see FIG. 6) by this etching step. The contact conductive layer 230a is formed during this step in the area masked by the resist layer R100. The contact conductive layer 230a is formed to be continuous with the first and second control gates 20 and 30. The insulating layer deposited in the region in which the silicide layer is formed in a subsequent step is removed by this etching; whereby the semiconductor substrate 10 is exposed. The resist layer R100 is then removed.

Figure 10:
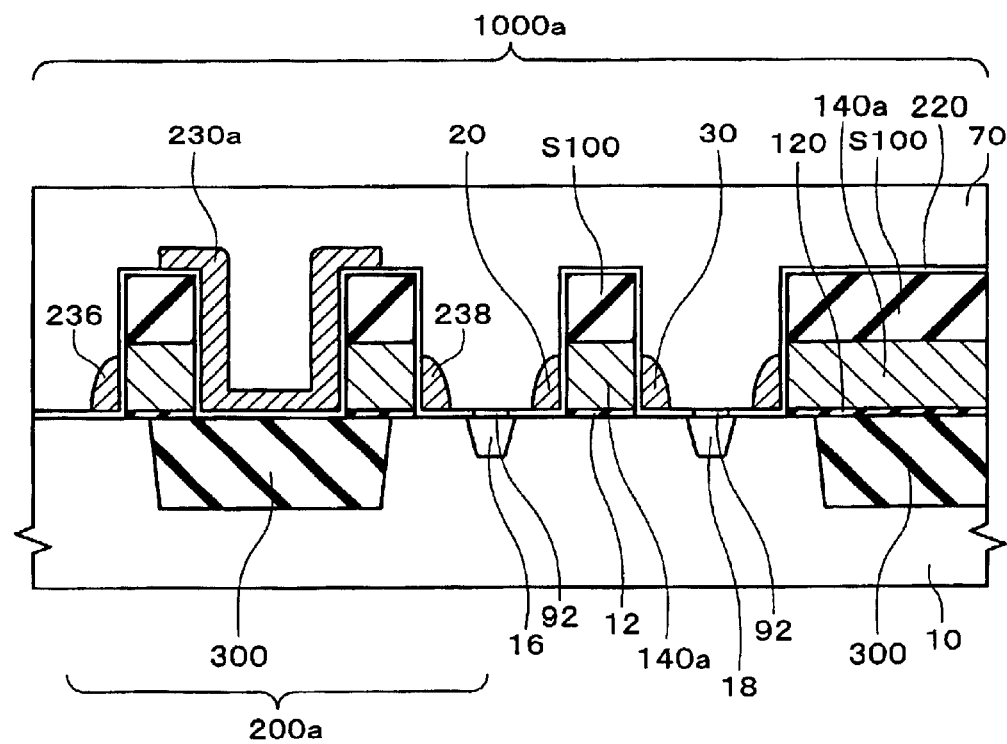
FIG. 10 is a cross-sectional view showing another step of the method of manufacturing the semiconductor device shown in FIGS. 1 to 3.

(6) As shown in FIG. 10, the impurity layers 16 and 18 which make up either a source region or a drain region are formed in the semiconductor substrate 10 by ion implantation with N-type impurities.

A metal for forming a silicide is deposited over the entire surface. As examples of a metal for forming a silicide, titanium, cobalt, and the like can be given. The metal formed on the impurity layers 16 and 18 are subjected to a silicidation reaction, thereby forming silicide layers 92 on the upper surfaces of the impurity layers 16 and 18. The surfaces of the source/drain regions of the memory cells 100 are self-alignably silicided by this silicidation step.

The insulating layer (second insulating layer) 70 such as silicon oxide or silicon nitride oxide is formed over the entire surface of the memory cell array formation region 1000a. The insulating layer 70 is formed so that the stopper layer S100 is covered with the insulating layer 70 and openings between the first and second control gates 20 and 30 and the contact conductive layer 230a are filled with the insulating layer 70.

Figure 11:
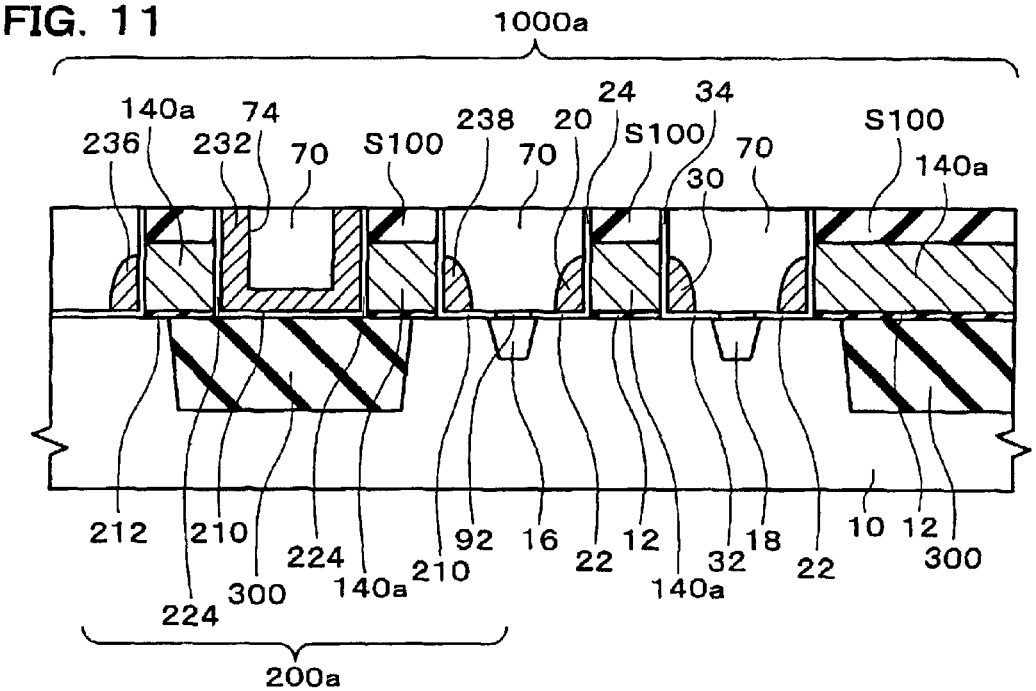
FIG. 11 is a cross-sectional view showing another step of the method of manufacturing the semiconductor device shown in FIGS. 1 to 3.

(7) As shown in FIG. 11, the insulating layer 70 is polished by using the CMP method so that the stopper layer S100 is exposed, whereby the insulating layer 70 is planarized. The insulating layer 70 remaining between the two first side insulating layers 24 which face each other with the first and second control gates 20 and 30 interposed therebetween becomes the embedding insulating layer 70. The upper part of the contact conductive layer 230a is removed by this step, whereby the contact conductive layer 232 is formed in the common contact section formation region 200a.

The upper ends of the first side insulating layers 24 and 34 formed on the sides of the gate layer 140a and the stopper layer S100 are located at a position higher than the upper ends of the first and second control gates 20 and 30.

The first and second control gates 20 and 30 are completely covered with the embedding insulating layer 70 by this step. The upper surface of the contact conductive layer 232 is exposed in the common contact section formation region 200a. The depression 74 formed by the contact conductive layer 232 is filled with the embedding insulating layer 70.

Figure 12:
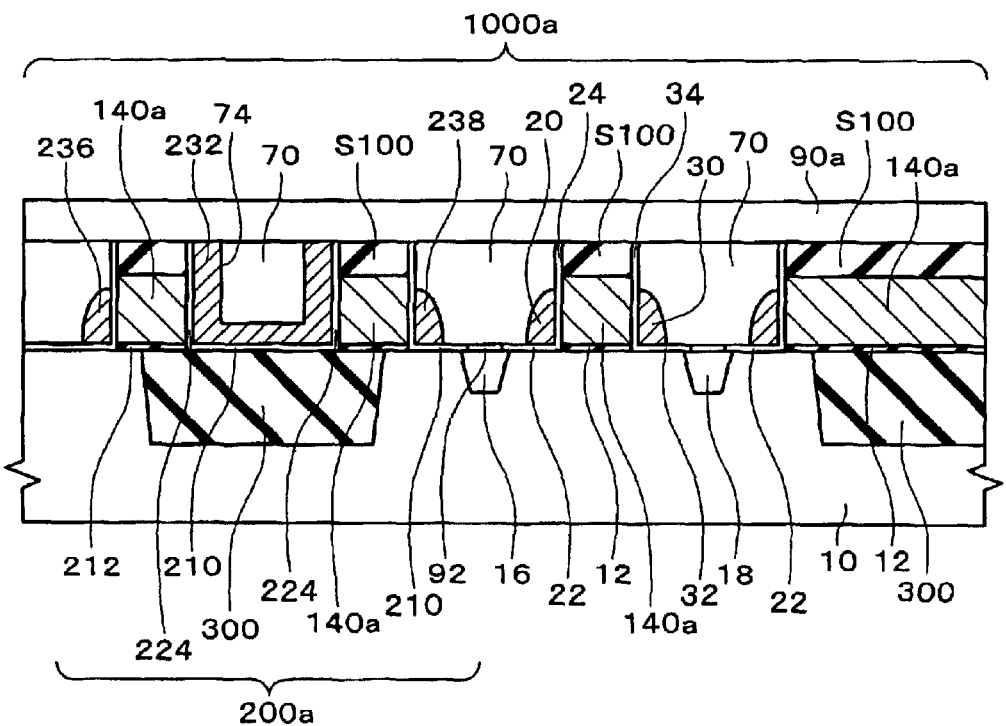
FIG. 12 is a cross-sectional view showing another step of the method of manufacturing the semiconductor device shown in FIGS. 1 to 3.
Figure 13:
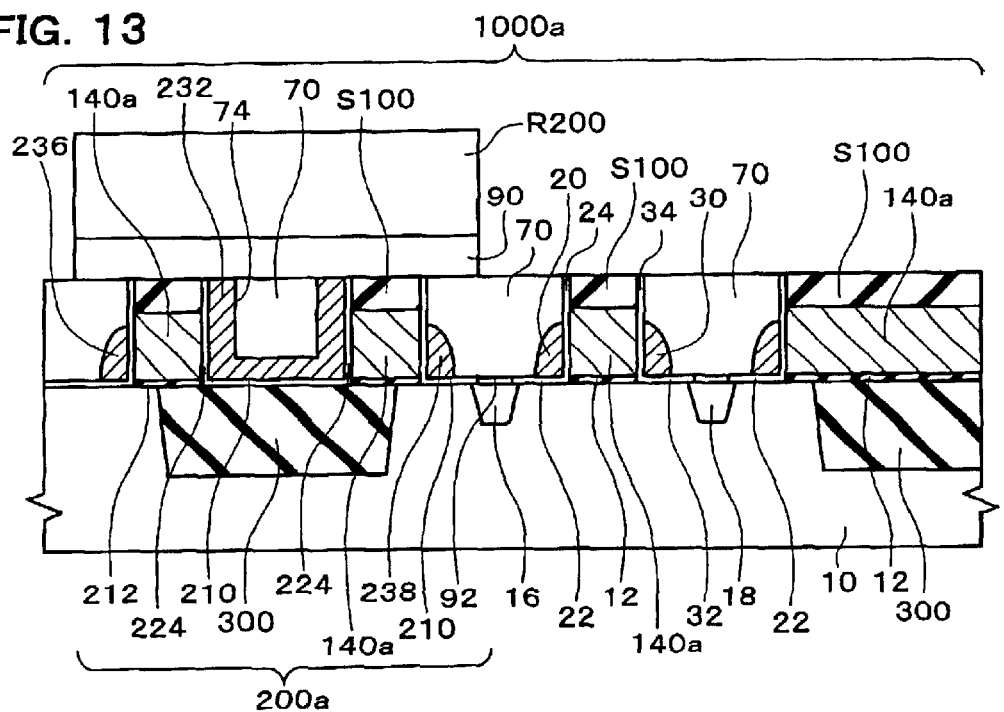
FIG. 13 is a cross-sectional view showing another step of the method of manufacturing the semiconductor device shown in FIGS. 1 to 3.
Figure 14:
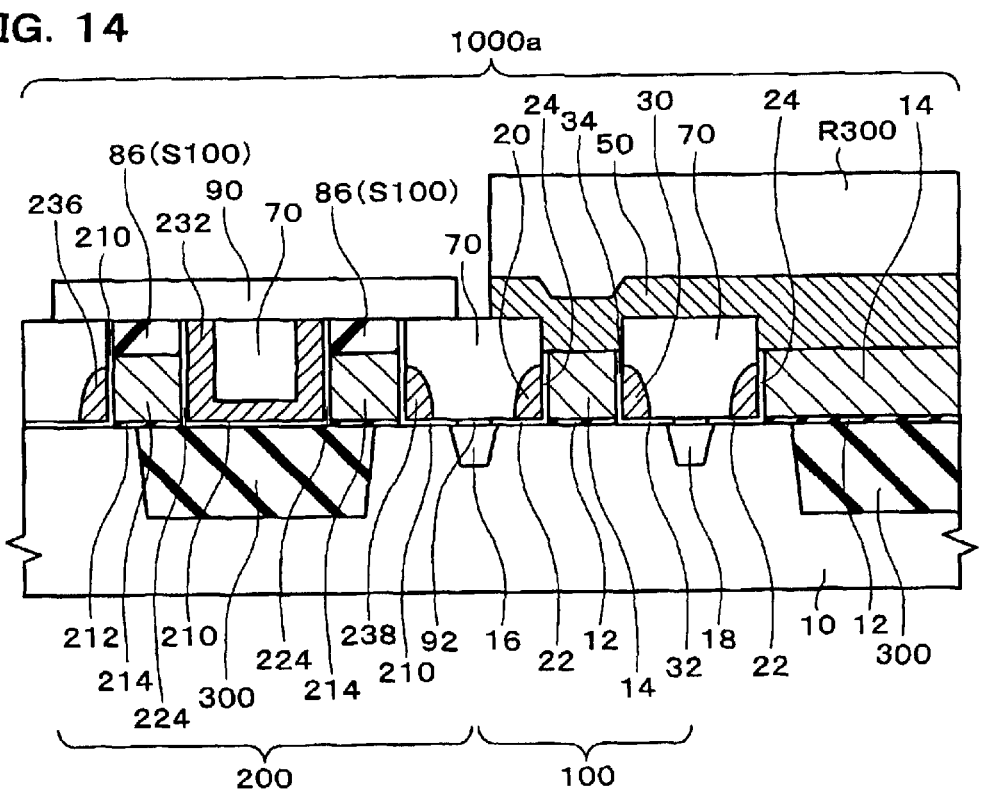
FIG. 14 is a cross-sectional view showing yet another step of the method of manufacturing the semiconductor device shown in FIGS. 1 to 3.
Figure 15:
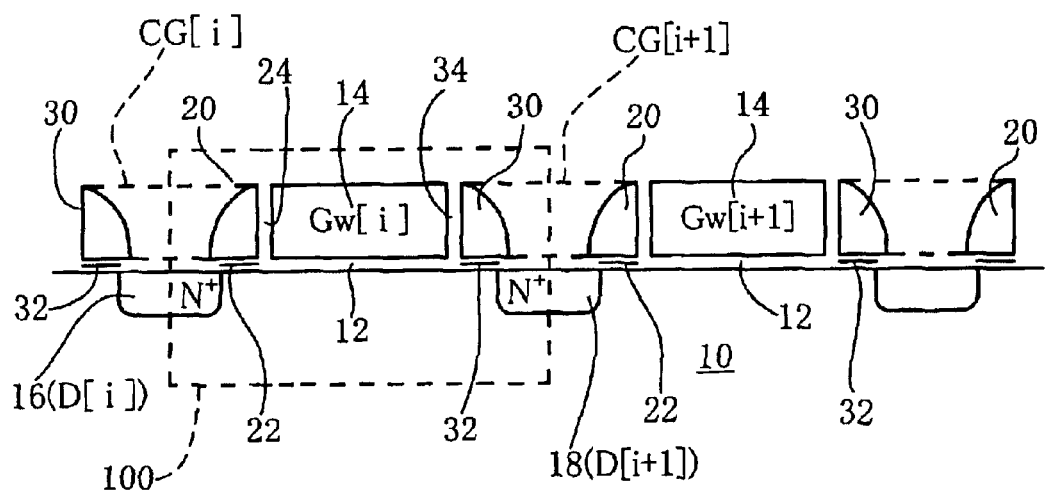
FIG. 15 is a cross-sectional view showing a conventional MONOS memory cell.

(8) As shown in FIG. 12, a third insulating layer 90a to be the cap insulating layer 90 is formed over the entire surface of the memory cell array formation region 1000a. A patterned resist layer R200 is formed on the third insulating layer 90a. The third insulating layer 90a is patterned by using the resist layer R200 as a mask, thereby forming the cap insulating layer 90 in the common contact section formation region 200a, as shown in FIG. 13. The resist layer R200 is then removed.

The third conductive layer (not shown) is formed over the entire surface of the memory cell array formation region 1000a. A patterned resist layer R300 is then formed on the third conductive layer. The third conductive layer is patterned by using the resist layer R300 as a mask, thereby forming the word line 50. As the third conductive layer, a doped polysilicon layer, a metal layer, an alloy layer such as silicide, or a layer in which two or more of these layers are stacked may be used. The gate layer 140a (see FIG. 12) formed of doped polysilicon is patterned by using the resist layer R300 as a mask, thereby forming the word gates 14 arranged in an array and the conductive layer 214 on which the stopper insulating layer 86 is formed. The resist layer R300 is then removed.

In this etching step, since the first and second control gates 20 and 30 and the conductive layers 236 and 238 are covered with the insulating layer 70, the first and second control gates 20 and 30 and the conductive layers 236 and 238 are allowed to remain without being etched.

The entire surface of the semiconductor substrate 10 is doped with P-type impurities. This causes the P-type impurity layers (element isolation impurity layers) 15 (see FIG. 2) to be formed in the regions between the word gates 14 in the Y direction. The conductivity type of the element isolation impurity layers 15 is opposite to the conductivity type of the nonvolatile memory device. The elements of the memory cells 100 can be isolated from one another more reliably by the P-type impurity layers 15.

(9) After stacking an interlayer dielectric, a contact hole is formed by using a conventional method. After forming a conductive layer in the contact hole, an interconnect layer to be electrically connected with the conductive layer is formed. For example, the contact hole 84 is formed on the contact conductive layer 232 through the cap insulating layer 90 and the interlayer dielectric 72, as shown in FIG. 3.

After filling the contact hole 84 with the plug conductive layer 82, the interconnect layer 80 connected with the plug conductive layer 82 is formed. In the step of forming the contact hole 84, the depression 74 is filled with the plug conductive layer 82 after removing the insulating layer 70 embedded in the depression 74 formed by the contact conductive layer 232.

The semiconductor device shown in FIGS. 1 to 3 is manufactured by these steps.

According to the method of manufacturing the semiconductor device of the present embodiment, the common contact section 200 can be formed together with the first and second control gates 20 and 30 in the shape of sidewalls without increasing the number of steps. Since the common contact section 200 has a size close to at least the widths of the impurity layers 16 and 18, a sufficiently large contact area can be secured. Therefore, in the present embodiment, reliable electrical connection with the control gates 20 and 30 can be secured through the common contact section 200, even if the control gates 20 and 30 are in the shape of sidewalls for which it is difficult to provide a sufficient contact area.

According to the method of manufacturing the semiconductor device of the present embodiment, the plug conductive layer 82 is formed on the contact conductive layer 232. Since the stopper insulating layer 86 is provided outside the contact conductive layer 232, an alignment margin when forming the plug conductive layer 82 can be secured.

The embodiment of the present invention is described above. However, the present invention is not limited thereto. Various modifications and variations are possible within the scope of the present invention. For example, a bulk semiconductor substrate is used as the semiconductor layer in the above embodiment. However, a semiconductor layer of an SOI substrate may be used.

What is claimed is:

1. A semiconductor device including a memory cell array in which nonvolatile memory devices are arranged in a matrix of a plurality of rows and columns, wherein each of the nonvolatile memory devices comprises;

a word gate which is formed over a microconductor layer with a second gate insulating layer interposed therebetween;

an impurity layer which is formed in the semiconductor layer and forms at least one of a source region and a drain region; and first and second control gates is a shape of sidewalls which are formed along two opposing sides of the word gate, respectively, wherein the first control gate is disposed over the semiconductor layer with a first gate insulating layer interposed therebetween, a first side insulating layer being interposed between the first control gate and the word gate, wherein the second control gate is disposed over the semiconductor layer with a first gate insulating layer interposed therebetween, a first side insulating layer being interposed between the second control gate and the word gate, wherein each of the first and second control gates extends in a first direction, wherein the first and second control gates adjacent in a second direction, which intersects the first direction, with the impurity layer interposed therebetween are connected with a common contact section, wherein the common contact section includes a contact conductive layer, a stopper insulating layer, and a cap insulating layer, wherein the contact conductive layer is continuous with the first and second control gates, wherein the stopper insulating layer in disposed outside the contact conductive layer, and wherein the cap insulating layer is formed at least over the stopper insulating layer.

2. The semiconductor device an defined in claim 1, wherein the contact conductive layer is disposed inside the cap insulating layer with a second side insulating layer interposed therebetween.

3. The semiconductor device as defined in claim 1, wherein the contact conductive layer is formed of the same material as the first and second control gates.

4. The semiconductor device as defined in claim 1, wherein an upper surface of the contact conductive layer and an upper surface of the stopper insulating layer are formed on substantially the same level.

5. The semiconductor device as defined in claim 1, wherein the stopper insulating layer is formed of a material including silicon nitride as an essential component, and wherein the cap insulating layer is formed of a material including silicon oxide as an essential component.

6. The semiconductor device as defined in claim 1, wherein an interlayer dielectric is further provided over the cap insulating layer, wherein the contact conductive layer includes a depression on which a contact hole is formed, the contact hole being formed through the cap insulating layer and the interlayer dielectric, and wherein the contact hole is filled with a plug conductive layer.

7. The semiconductor device as defined in claim 1, wherein the contact conductive layer is disposed over the semiconductor layer with a contact insulating layer interposed therebetween, and wherein the contact insulating layer is formed of the same material as the first gate insulating layer.

8. The semiconductor device as defined in claim 2, wherein the second side insulating layer is formed of the same material as the first side insulating layer.

9. The semiconductor device as defined in claim 1, wherein an upper end of the first side insulating layer is located higher than the first and second control gates.

10. The semiconductor device as defined in claim 1, wherein the first and second control gates adjacent to each other are covered with an insulating layer.

11. The semiconductor device as defined in claim 1, wherein the common contact section is provided adjacent to an end of the impurity layer.

12. The semiconductor device as defined in claim 11, wherein a plurality of the impurity layers are arranged, and wherein a plurality of the common contact sections are provided alternately on one ends and opposite ends of the plurality of the impurity layers.

13. The semiconductor device as defined in claim 1, wherein each of the first gate insulating layer and the first side insulating layer is formed of a stacked film including a first silicon oxide layer, a silicon nitride layer, and a second silicon oxide layer.

* * * * *